(12) United States Patent
Derderian et al.

(10) Patent No.: US 7,276,393 B2
(45) Date of Patent: Oct. 2, 2007

(54) MICROELECTRONIC IMAGING UNITS AND METHODS OF MANUFACTURING MICROELECTRONIC IMAGING UNITS

(75) Inventors: James M. Derderian, Boise, ID (US); Bret K. Street, Meridian, ID (US); Eric T. Mueller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/927,550

(22) Filed: Aug. 26, 2004

(65) Prior Publication Data

US 2006/0046332 A1    Mar. 2, 2006

(51) Int. Cl.
*H01L 21/00* (2006.01)

(52) U.S. Cl. ............... 438/51; 438/48; 438/55; 438/64; 257/433; 257/724; 257/E21.499

(58) Field of Classification Search ............ 438/25–26, 438/31, 51, 55, 106, 113–460
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,560,047 A | 10/1996 | Shimada |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |

(Continued)

FOREIGN PATENT DOCUMENTS

EP        0 886 323        12/1998

(Continued)

OTHER PUBLICATIONS

U.S. Appl. No. 10/893,022, filed Jul. 16, 2004, Hall et al.

(Continued)

*Primary Examiner*—Dung A. Le
(74) *Attorney, Agent, or Firm*—Dickstein Shapiro LLP

(57) ABSTRACT

Methods for manufacturing microelectronic imaging units and microelectronic imaging units that are formed using such methods are disclosed herein. In one embodiment, a method includes providing a plurality of imaging dies on a microfeature workpiece. The individual imaging dies include an image sensor, an integrated circuit operably coupled to the image sensor, and a plurality of external contacts operably coupled to the integrated circuit. The method further includes attaching a plurality of covers to corresponding imaging dies, cutting the microfeature workpiece to singulate the imaging dies, and coupling the singulated dies to a support member. The covers can be attached to the imaging dies before or after the workpiece is cut.

7 Claims, 6 Drawing Sheets

U.S. PATENT DOCUMENTS

| | | |
|---|---|---|
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,372,548 B2 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Kang et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,864,172 B2 | 3/2005 | Noma et al. |
| 6,882,021 B2 | 4/2005 | Boon et al. |
| 6,934,065 B2 | 8/2005 | Kinsman |
| 6,946,325 B2 | 9/2005 | Yean et al. |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Hamden et al. |
| 2004/0012698 A1 | 1/2004 | Suda et al. |
| 2004/0023459 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |
| 2005/0255626 A1 | 11/2005 | Kinsman |
| 2006/0035401 A1* | 2/2006 | Kobayashi et al. ........... 438/60 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/901,851, filed Jul. 28, 2004, Derderian et al.
U.S. Appl. No. 10/915,180, filed Aug. 10, 2004, Street et al.
Micro Chem, Nano SU-8, Negative Tone Photoresist Formulations 50-100, 4 pages, Feb. 2002, <http://www.microchem.com/products/pdf/SUB_50-100.pdf>.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, Amercian Institute of Physics.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
DuPont Electronic Materials, Data Sheet, Pyralux PC 2000 Flexible Composites, 4 pages, Oct. 1998, <http://www.dupont.com/fcm>.
U.S. Appl. No. 10/785,466, Kirby.
U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/894,262, Farnworth et al.
U.S. Appl. No. 10/910,491, Bolken et al.
U.S. Appl. No. 10/919,604, Farnworth et al.
U.S. Appl. No. 10/922,177, Oliver et al.
U.S. Appl. No. 10/922,192, Farnworth et al.
U.S. Appl. No. 10/925,406, Oliver.
U.S. Appl. No. 10/925,501, Oliver.
U.S. Appl. No. 10/925,502, Watkins et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Blackburn, J.M. et al. "Deposition of Conformal Copper and Nickel Films from Supercritical Carbon Dioxide," Science, vol. 294, pp. 141-145, Oct. 5, 2001.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of Imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™ Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, pp. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index/htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

MICROELECTRONIC IMAGING UNITS AND METHODS OF MANUFACTURING MICROELECTRONIC IMAGING UNITS

TECHNICAL FIELD

The present invention is related to microelectronic imaging units having solid-state image sensors and methods for manufacturing such imaging units.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

FIG. 1 is a schematic side cross-sectional view of a conventional microelectronic imaging unit 1 including an imaging die 10, a chip carrier 30 carrying the die 10, and a cover 50 attached to the carrier 30 and positioned over the die 10. The imaging die 10 includes an image sensor 12 and a plurality of bond-pads 16 operably coupled to the image sensor 12. The chip carrier 30 has a base 32, sidewalls 34 projecting from the base 32, and a recess 36 defined by the base 32 and sidewalls 34. The die 10 is accordingly sized to be received within the recess 36 and attached to the base 32. The chip carrier 30 further includes an array of terminals 18 on the base 32, an array of contacts 24 on an external surface 38, and a plurality of traces 22 electrically connecting the terminals 18 to corresponding external contacts 24. The terminals 18 are positioned between the die 10 and the sidewalls 34 so that wire-bonds 20 can electrically couple the terminals 18 to corresponding bond-pads 16 on the die 10.

One problem with the microelectronic imaging unit 1 illustrated in FIG. 1 is that the die 10 must be sized and configured to fit within the recess 36 of the chip carrier 30. Dies having different shapes and/or sizes accordingly require chip carriers configured to house those specific types of dies. As such, manufacturing imaging units with dies having different sizes requires fabricating various configurations of chip carriers and significantly retooling the manufacturing process.

Another problem with conventional microelectronic imaging units is that they have relatively large footprints and occupy a significant amount of vertical space (i.e., high profiles). For example, the footprint of the imaging unit 1 in FIG. 1 is the surface area of the base 32 of the chip carrier 30, which is significantly larger than the surface area of the die 10. Accordingly, the footprint and vertical profile of conventional microelectronic imaging units can be a limiting factor in the design and marketability of picture cell phones or PDAs because these devices are continually being made smaller in order to be more portable. Therefore, there is a need to provide microelectronic imaging units with smaller footprints and lower vertical profiles.

BRIEF DESCRIPTION OF THE DRAWINGS

FIGS. 2A-4 illustrate stages in one embodiment of a method for manufacturing a plurality of microelectronic imaging units in accordance with the invention.

FIG. 2A is a schematic side cross-sectional view of a microfeature workpiece having a substrate and a plurality of microelectronic imaging dies formed in and/or on the substrate.

FIG. 4 is a schematic side cross-sectional view of the assembly after (a) forming a plurality of dams on corresponding imaging dies and (b) depositing a fill material onto the support member between a barrier and the imaging dies.

DETAILED DESCRIPTION

A. Overview

Figure 1:
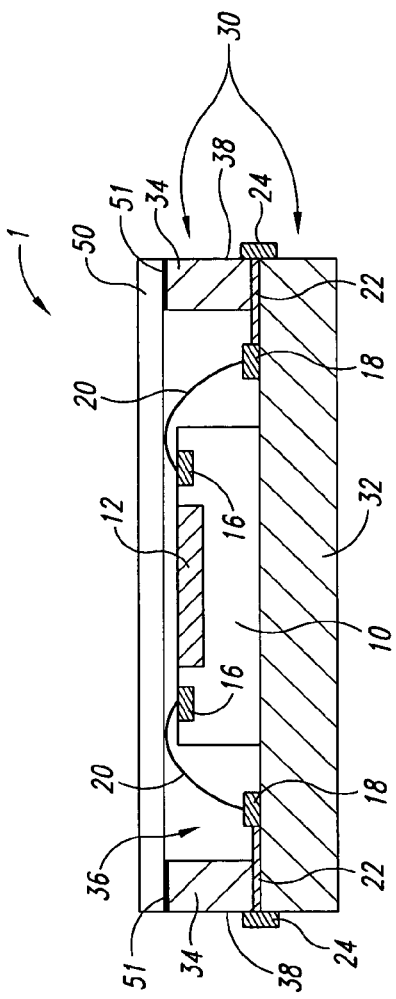
FIG. 1 is a schematic side cross-sectional view of a conventional microelectronic imaging unit in accordance with the prior art.

The following disclosure describes several embodiments of methods for manufacturing microelectronic imaging units and microelectronic imaging units that are formed using such methods. One aspect of the invention is directed toward methods for manufacturing a plurality of imaging units. An embodiment of one such method includes providing a plurality of imaging dies on a microfeature workpiece. The individual imaging dies include an image sensor, an integrated circuit operably coupled to the image sensor, and a plurality of external contacts operably coupled to the integrated circuit. The method further includes attaching a plurality of covers to corresponding imaging dies, cutting the microfeature workpiece to singulate the imaging dies, and coupling the singulated dies to a support member. The microfeature workpiece can be cut before or after the covers are attached to the imaging dies. The covers can be attached to the imaging dies with an adhesive that is disposed outboard the image sensor and defines a cell between the cover and the die. Alternatively, the adhesive can be disposed between the cover and the image sensor.

In another embodiment, a method includes coupling a plurality of singulated imaging dies to a support member, placing a plurality of covers on corresponding imaging dies with the covers disposed inboard of the external contacts of the imaging dies, electrically connecting the external contacts to corresponding terminals on the support member, and forming a plurality of dams on corresponding dies. The individual dams are arranged to define a perimeter around the corresponding covers. The method may further include forming a barrier on the support member between adjacent dies and depositing a fill material onto the support member between the barrier and the imaging dies. The fill material can at least partially encapsulate the imaging dies.

Another aspect of the invention is directed toward a plurality of microelectronic imaging units. In one embodiment, an assembly of imaging units includes a support member and a plurality of imaging dies carried by the support member. The support member includes a plurality of terminal arrays, and the individual imaging dies include a first side, a second side attached to the support member, an image sensor, an integrated circuit operably coupled to the image sensor, and a plurality of external contacts operably coupled to the integrated circuit. The assembly further includes a plurality of covers attached to the first side of corresponding dies, a plurality of wire-bonds electrically connecting the external contacts to corresponding terminals, and a barrier on the support member between adjacent imaging dies. The assembly may further include a plurality of dams on corresponding dies and a fill material on the support member between the barrier and the imaging dies. The individual dams form a perimeter around the corresponding cover and inhibit the fill material from flowing onto the cover.

Another aspect of the invention is directed toward a microelectronic imaging unit. In one embodiment, an imaging unit includes a support member having a base, a plurality of sidewalls projecting from the base, a recess defined by the sidewalls and the base, and a plurality of terminals in the base and/or sidewalls. The imaging unit further includes an imaging die received in the recess and attached to the base of the support member. The imaging die has an image sensor, an integrated circuit operably coupled to the image sensor, and a plurality of external contacts operably coupled to the integrated circuit. The imaging unit further includes a cover attached to the imaging die, a plurality of wire-bonds electrically connecting the external contacts to corresponding terminals, and a fill material in the recess between the imaging die and the sidewalls.

Specific details of several embodiments of the invention are described below with reference to CMOS imaging units to provide a thorough understanding of these embodiments, but other embodiments can use CCD imaging units or other types of solid-state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, it should be understood that the invention may have other embodiments with additional elements or without several of the elements described below with reference to FIGS. 2A-6.

B. Embodiments of Methods for Manufacturing Microelectronic Imaging Units

Figure 2A:
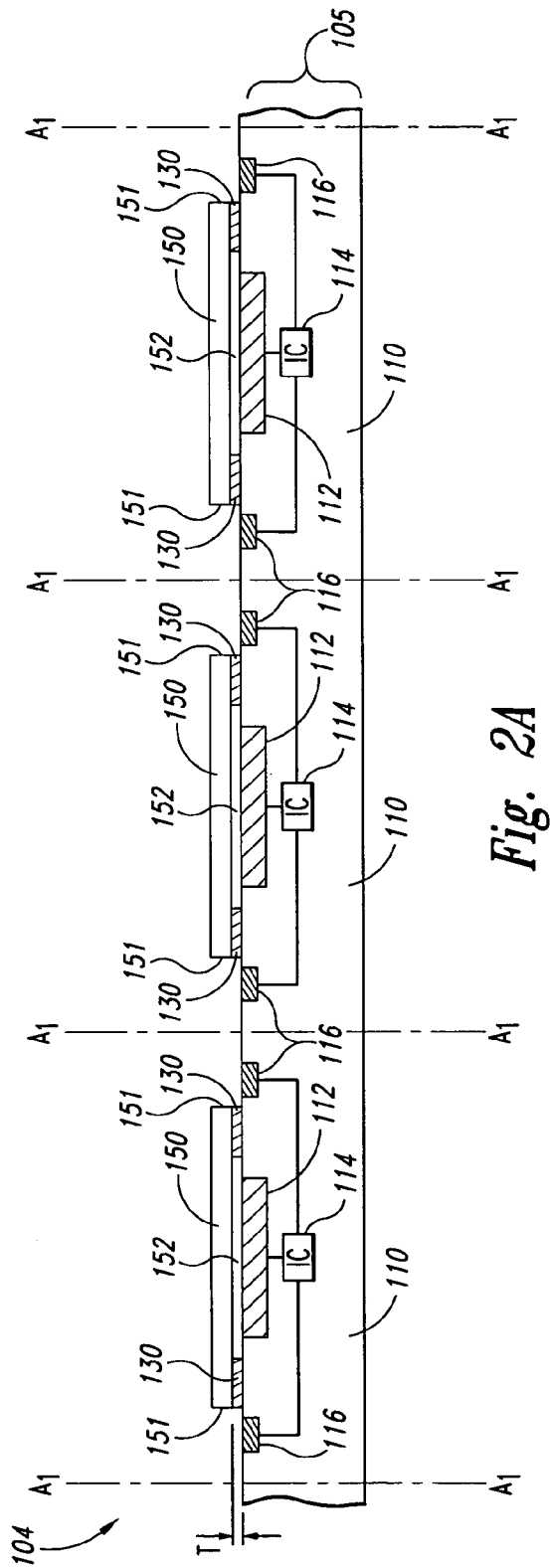

FIGS. 2A-4 illustrate stages of a method for manufacturing a plurality of microelectronic imaging units in accordance with one embodiment of the invention. FIG. 2A, for example, is a schematic side cross-sectional view of a microfeature workpiece 104 having a substrate 105 and a plurality of microelectronic imaging dies 110 (only three are shown) formed in and/or on the substrate 105. The individual imaging dies 110 include an image sensor 112, an integrated circuit 114 (shown schematically) operably coupled to the image sensor 112, and a plurality of external contacts 116 (e.g., bond-pads) operably coupled to the integrated circuit 114. The image sensors 112 can be CMOS devices or CCD image sensors for capturing pictures or other images in the visible spectrum. The image sensors 112 may also detect radiation in other spectrums (e.g., IR or UV ranges).

Figure 2B:
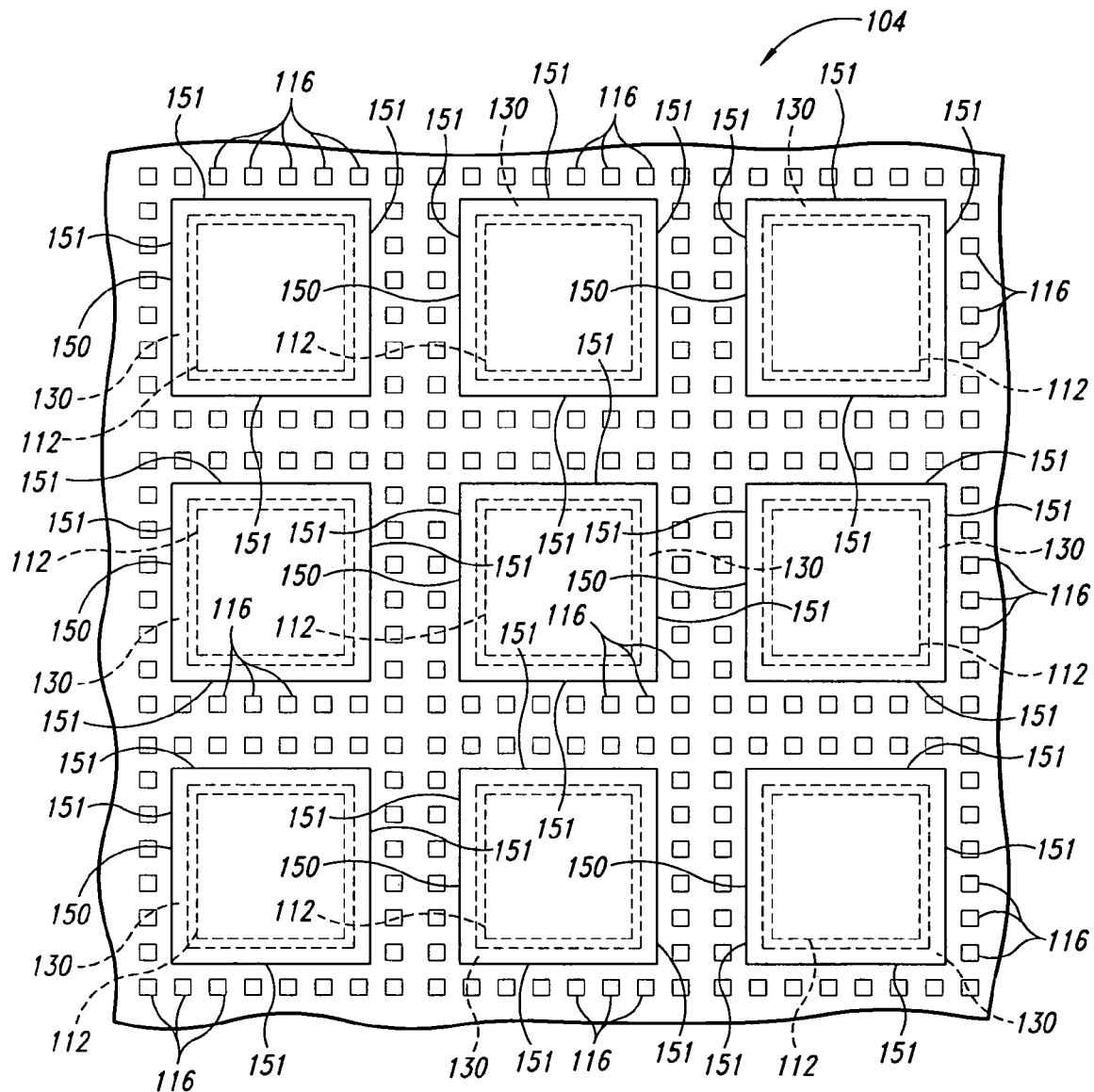
FIG. 2B is a top plan view of the workpiece illustrated in FIG. 2A.

FIG. 2B is a top plan view of the microfeature workpiece 104 illustrated in FIG. 2A. Referring to both FIGS. 2A and 2B, after forming the imaging dies 110, a plurality of covers 150 are attached to corresponding dies 110 and positioned over the image sensors 112. The covers 150 can be glass, quartz, or another suitable material that is transmissive to the desired spectrum of radiation. The covers 150, for example, can further include one or more anti-reflective films and/or filters. The covers 150 include a plurality of ends 151, and although in the illustrated embodiment, the ends 151 are inboard the external contacts 116, in other embodiments, the ends 151 may not be inboard the external contacts 116. The ends 151 of the covers 150 are inboard the external contacts 116 in the sense that they are within the perimeters defined by the sets of external contacts 116.

The covers 150 are attached to the imaging dies 110 with an adhesive 130. The adhesive 130 has a thickness T (FIG. 2A) and spaces the covers 150 apart from the imaging dies 110 by a precise, predetermined distance. In the illustrated embodiment, the discrete portions of the adhesive 130 are disposed between a perimeter portion of the individual covers 150 and the dies 110. As such, the discrete portions of the adhesive 130 are positioned outboard the corresponding image sensor 112 and inboard the external contacts 116 (e.g., between the image sensor 112 and the external contacts 116). In other embodiments, such as those described below with reference to FIG. 5, the adhesive 130 may also be disposed between the covers 150 and the image sensors 112.

In the illustrated embodiment, the individual portions of adhesive 130 form a perimeter around the corresponding image sensor 112 and define a cell 152 (FIG. 2A) between the cover 150 and the image sensor 112. The cells 152 can be filled with gas, such as air, underfill material, or another suitable material. In other embodiments, the adhesive 130 may not form perimeters around the image sensors 112. For example, several discrete volumes of the adhesive 130 can be placed around each image sensor 112 to couple the corresponding cover 150 to the die 110. The discrete volumes of the adhesive 130 can be disposed proximate to the corners of the covers 150 or positioned in other arrangements.

The adhesive 130 can be an epoxy, acrylic, or other suitable material that is applied to the covers 150 and/or the imaging dies 110 by stencil printing, screen printing, dispensing, photolithography, or other suitable techniques. In embodiments in which the adhesive 130 is a UV- or thermally-curable material, the workpiece 104 can be heated to at least partially cure (i.e., B-stage) the adhesive 130 after attaching the covers 150 to the substrate 105 (FIG. 2A). After curing, the workpiece 104 can be cut along lines $A_1$-$A_1$ (FIG. 2A) to singulate the individual dies 110.

Figure 3A:
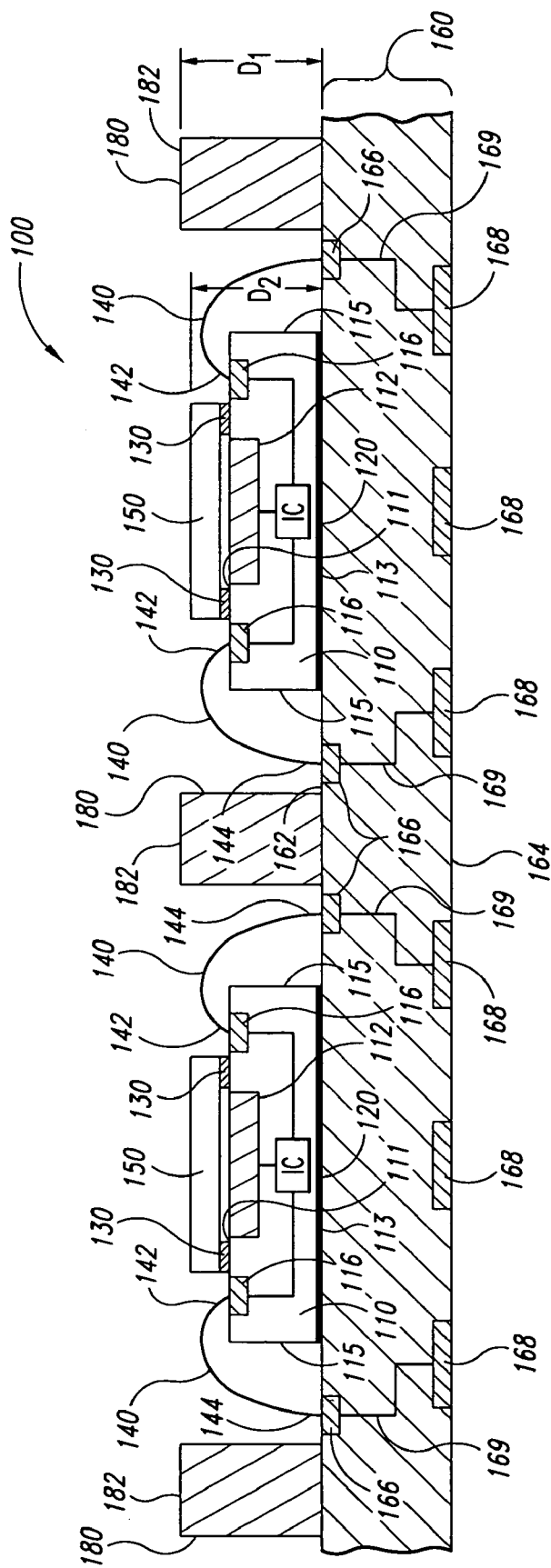
FIG. 3A is a schematic side cross-sectional view of an assembly including singulated microelectronic imaging dies arranged in an array on a support member.

FIG. 3A is a schematic side cross-sectional view of an assembly 100 including the singulated microelectronic imaging dies 110 (only two are shown) arranged in an array on a support member 160. The individual singulated dies 110 include a first side 111, a second side 113 opposite the first side 111, and a plurality of ends 115 extending from the first side 111 to the second side 113. The second side 113 of the imaging dies 110 is attached to the support member 160 with an adhesive 120, such as an adhesive film, epoxy, or other suitable material. In several embodiments, the covers 150 can be attached to the imaging dies 110 after the dies 110 are coupled to the support member 160.

The support member 160 can be a lead frame or a substrate, such as a printed circuit board, for carrying the imaging dies 110. In the illustrated embodiment, the support member 160 includes a first side 162 having a plurality of terminals 166 and a second side 164 having a plurality of pads 168. The terminals 166 can be arranged in arrays for attachment to corresponding external contacts 116 of the dies 110, and the pads 168 can be arranged in arrays for attachment to a plurality of conductive couplers (e.g., solder balls). The support member 160 further includes a plurality of conductive traces 169 electrically coupling the terminals 166 to corresponding pads 168.

Figure 3B:
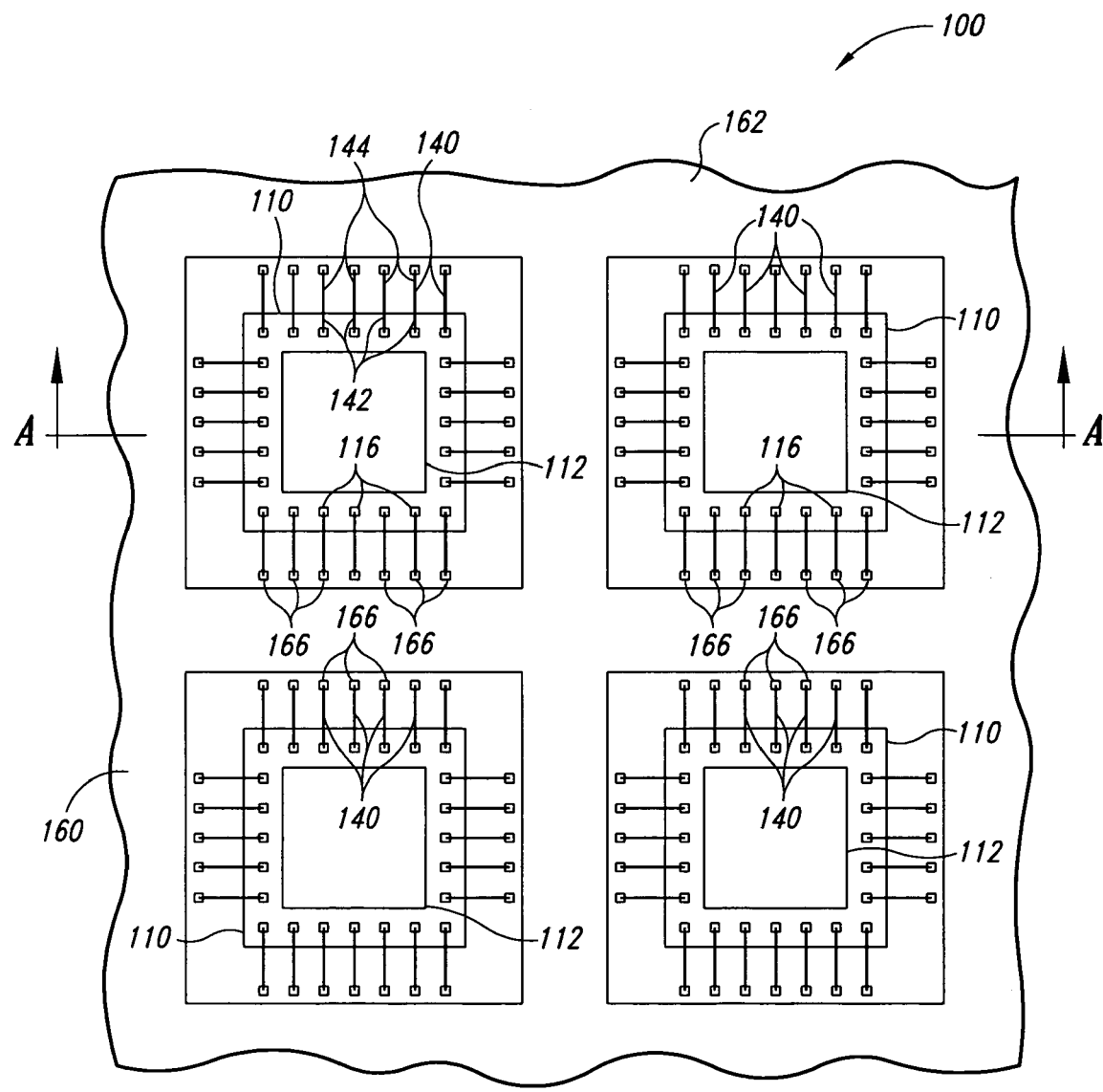
FIG. 3B is a top plan view of the assembly illustrated in FIG. 3A.

FIG. 3B is a top plan view of the assembly 100 illustrated in FIG. 3A. Referring to both FIGS. 3A and 3B, the assembly 100 further includes a plurality of wire-bonds 140 electrically coupling the external contacts 116 of the imaging dies 110 to corresponding terminals 166 on the support member 160. The individual wire-bonds 140 include a proximal portion 142 attached to one of the contacts 116 and a distal portion 144 attached to the corresponding terminal 166. In other embodiments, the external contacts 116 can be electrically connected to terminals on a support member by conductive through-wafer interconnects. Through-wafer interconnects are described in U.S. patent application Ser. No. 10/713,878 filed on Nov. 13, 2003, which is hereby incorporated by reference.

The illustrated assembly 100 further includes a barrier 180 formed on the support member 160 between adjacent imaging dies 110. The barrier 180 forms the outer sidewalls of the individual imaging units, as described in greater detail below. Although in the illustrated embodiment, the barrier 180 is disposed outboard the wire-bonds 140 and the terminals 166, in other embodiments, the barrier 180 may cover or partially encapsulate the wire-bonds 140 and/or the terminals 166. The barrier 180 can be formed by transfer molding, stereolithography, stencil printing, screen printing, or other suitable processes. The barrier 180 projects a first distance $D_1$ from the support member 160, and the die 110 and cover 150 project a second distance $D_2$ from the support member 160. In the illustrated embodiment, the first distance $D_1$ is greater than the second distance $D_2$, and the barrier 180 has a generally flat top surface 182 to which a camera module or other optical device can be mounted. In other embodiments, the first distance $D_1$ can be equal to or less than the second distance $D_2$ and/or the top surface 182 may not be generally flat. Alternatively, in several embodiments such as those described below with reference to FIG. 5, the assembly 100 may not include the barrier 180.

Figure 4:
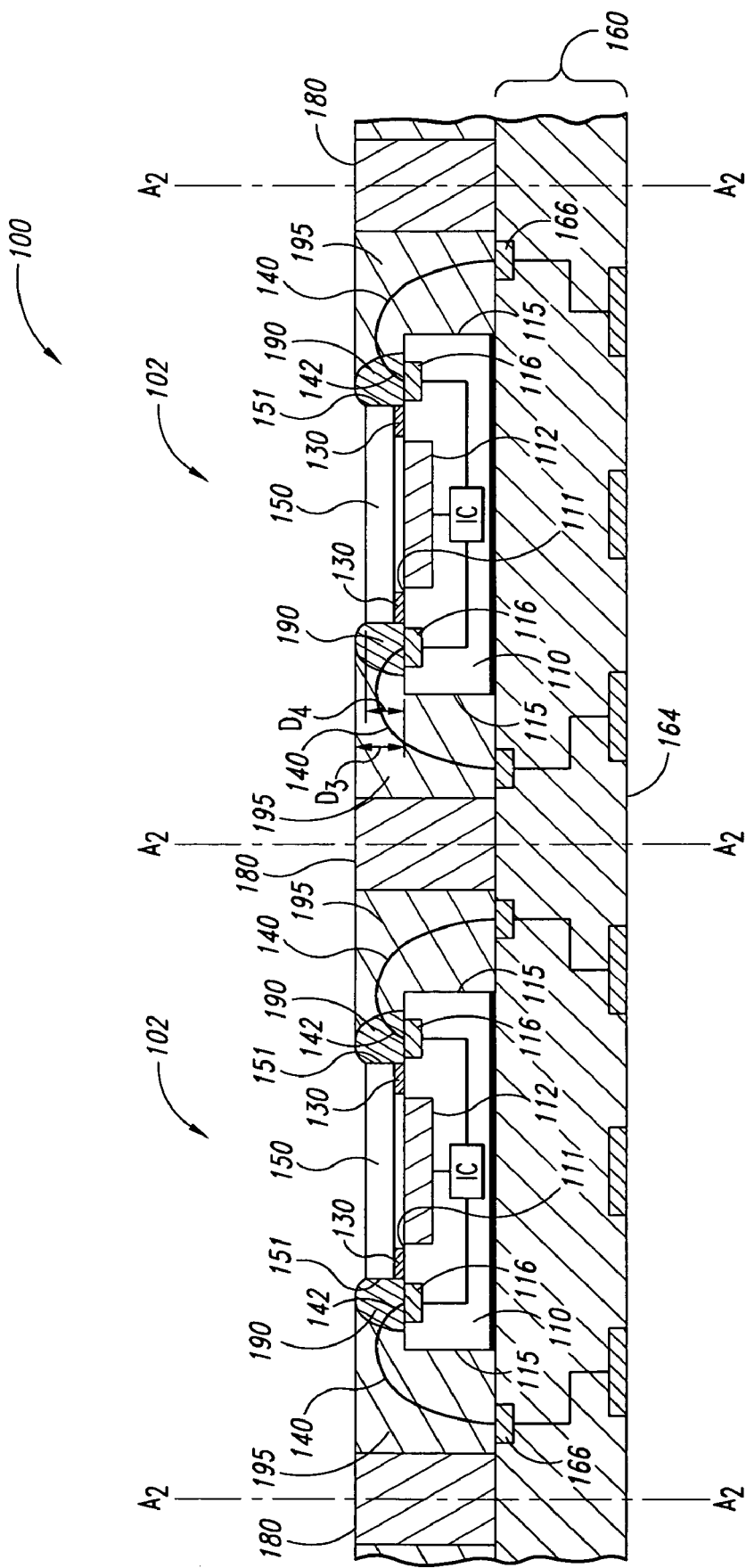

FIG. 4 is a schematic side cross-sectional view of the assembly 100 after (a) forming a plurality of dams 190 on corresponding imaging dies 110 and (b) depositing a fill material 195 onto the support member 160 between the barrier 180 and the imaging dies 110. The illustrated dams 190 are formed on the first side 111 of the imaging dies 110 outboard the covers 150 and inhibit the fill material 195 from flowing onto the covers 150 and obstructing the passage of radiation through the covers 150. As such, the dams 190 project a first distance $D_3$ from the dies 110, and the adhesive 130 and covers 150 project a second distance $D_4$ from the dies 110. The first distance $D_3$ can be greater than or equal to the second distance $D_4$. Moreover, the dams 190 may also encapsulate the ends 151 of the covers 150 and/or the proximal portion 142 of the individual wire-bonds 140. The dams 190 can be an epoxy, polyimide, acrylic, or other suitable material for (a) enhancing the integrity of the joint between the individual covers 150 and the imaging dies 110, and (b) protecting the image sensors 112 from moisture, chemicals, and other contaminants. In other embodiments, the dams 190 may not encapsulate the ends 151 of the covers 150 and/or the proximal portion 142 of the wire-bonds 140. Alternatively, the assembly 100 may not include the dams 190, but rather the fill material 195 can contact the ends 151 of the covers 150 and the proximal portion 142 of the wire-bonds 140.

After forming the dams 190, the fill material 195 is dispensed onto the support member 160 and fills the recess between the imaging dies 110 and the barrier 180. The fill material 195 can be an epoxy mold compound or other suitable material to at least partially encapsulate the imaging dies 110, the wire-bonds 140, and the dams 190. As such, the fill material 195 (a) increases the robustness of the assembly 100, (b) supports the wire-bonds 140, and (c) protects the image sensors 112 from moisture, chemicals, and other contaminants. After depositing the fill material 195, the assembly 100 can be heated to at least partially cure (i.e., B-stage) the fill material 195, the dam 190, and/or the adhesive 130. After curing, the assembly 100 can be cut along lines $A_2$-$A_2$ to singulate individual imaging units 102.

One feature of the imaging units 102 illustrated in FIG. 4 is that the covers 150 are attached to the imaging dies 110 and positioned inboard the external contacts 116. An advantage of this feature is that the vertical profile or height of the imaging units 102 is reduced. For example, the vertical profile of the imaging units 102 is the distance between the top of the dam 190 and the second side 164 of the support member 160. By contrast, in prior art devices, such as the imaging unit 1 illustrated in FIG. 1, the cover 50 is attached to sidewalls 34 and sufficiently spaced apart from the image sensor 12 so that the wire-bonds 20 can extend from the bond-pads 16 to the terminals 18. Another advantage of this feature is that the material cost of the covers 150 is reduced because the covers 150 are smaller than conventional covers, such as the cover 50 illustrated in FIG. 1.

Another feature of the imaging units 102 illustrated in FIG. 4 is that the barrier 180 has a predetermined height D, and a generally flat top surface 182. An advantage of this feature is that camera modules and other devices can be mounted on the surface 182 and positioned at a precise distance over the image sensors 112. In prior art devices, camera modules are typically mounted on a stack of several components, each of which introduces greater variance in the height of the stack. For example, in FIG. 1, a camera module can be coupled to the cover 50, which is attached to an adhesive 51, which is coupled to the sidewall 34.

One feature of the method for manufacturing imaging units 102 illustrated in FIGS. 2A-4 is that the support member 160 can carry imaging dies 110 with different sizes and/or configurations. An advantage of this feature is that the method can be easily adapted to handle various configurations of imaging dies without significant changes to the fabrication process. Prior art methods, such as the method required to form the imaging unit 1 described above with reference to FIG. 1, may require significant retooling because the chip carriers 30 can only carry imaging dies 10 with a certain shape and size.

Another advantage of the method for manufacturing imaging units 102 illustrated in FIGS. 2A-4 is that the method is expected to significantly enhance the efficiency of the manufacturing process because a plurality of imaging units 102 can be fabricated simultaneously using highly accurate and efficient processes developed for packaging and manufacturing semiconductor devices. This method of manufacturing imaging units 102 is also expected to enhance the quality and performance of the imaging units 102 because the semiconductor fabrication processes can reliably produce and assemble the various components with a high degree of precision. As such, several embodiments of the method are expected to significantly reduce the cost for assembling microelectronic imaging units 102, increase the performance of the imaging units 102, and produce higher quality imaging units 102.

Figure 5:
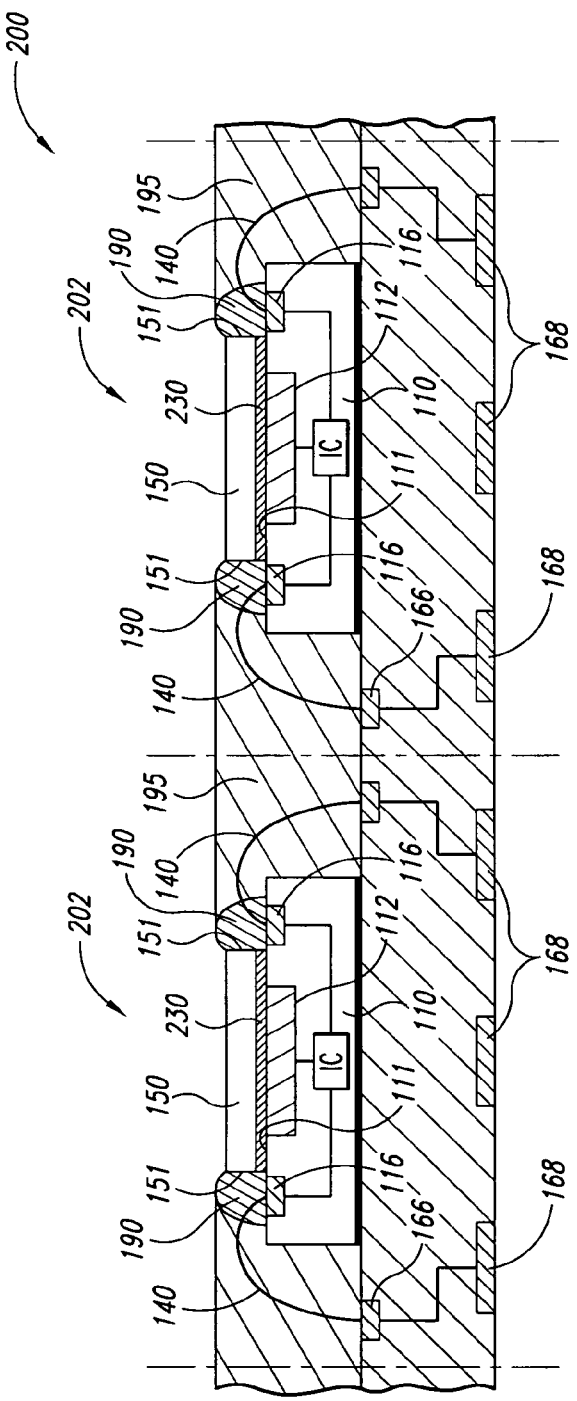
FIG. 5 is a schematic side cross-sectional view of an assembly including a plurality of microelectronic imaging units in accordance with another embodiment of the invention.

C. Additional Embodiments of Methods for Manufacturing Microelectronic Imaging Units FIG. 5 is a schematic side cross-sectional view of an assembly 200 including a plurality of microelectronic imaging units 202 in accordance with another embodiment of the invention. The microelectronic imaging units 202 are generally similar to the microelectronic imaging units 102 described above with reference to FIG. 4. The imaging units 202 shown in FIG. 5, however, do not include a barrier between adjacent dies 110. Rather, the fill material 195 fills the space between the adjacent imaging dies 110 and forms the sidewall of the imaging units 202 after the units 202 are singulated.

One feature of the imaging units 202 illustrated in FIG. 5 is that the wire-bonds 140 are encapsulated by the fill material 195 that forms the sidewalls of the individual units 202. An advantage of this feature is that the footprint of the individual imaging units 202 is smaller than the footprint of conventional imaging units. The reduced footprint of the imaging units 202 is particularly advantageous for picture cell phones, PDAs, or other applications where space is limited. In prior art devices, such as the imaging unit 1 illustrated in FIG. 1, the sidewalls 34 are outboard the terminals 18 and the wire-bonds 20, which increases the footprint of the imaging unit 1.

The illustrated assembly 200 further includes discrete portions of an adhesive 230 attaching the covers 150 to corresponding imaging dies 110. The individual portions of the adhesive 230 are disposed between the covers 150 and the first side 111 of the imaging dies 110 such that the adhesive 230 extends across the image sensors 112. The adhesive 230 can be an optical grade material with a high transparency to eliminate or reduce light scattering and/or the loss of images. In applications in which the image sensors 112 have pixels with a smaller size, the adhesive 230 can have a higher refractive index to assist in focusing the light for the pixels.

One feature of the imaging units 202 illustrated in FIG. 5 is that the adhesive 230 can be a material that is dimensionally stable over a wide range of temperatures. An advantage of this feature is that the distance between the covers 150 and the corresponding image sensors 112 remains generally consistent, even if the imaging units 202 operate in an environment that experiences significant changes in ambient temperature. If the temperature change were to cause the medium between the cover 150 and the image sensor 112 to expand or contract, the associated change in the distance between the cover 150 and the image sensor 112 could skew the images and reduce the life of the imaging unit 202 due to fatigue.

Figure 6:
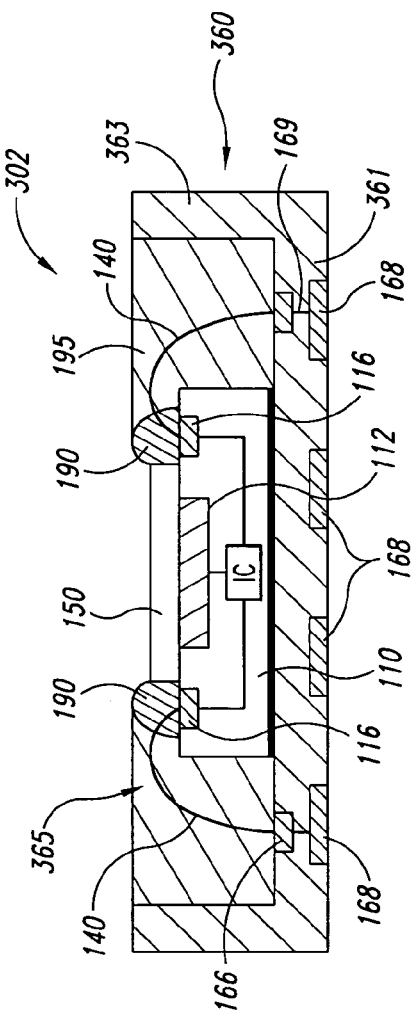
FIG. 6 is a schematic side cross-sectional view of an imaging unit in accordance with another embodiment of the invention.

FIG. 6 is a schematic side cross-sectional view of an imaging unit 302 in accordance with another embodiment of the invention. The microelectronic imaging unit 302 is generally similar to the imaging unit 102 described above with reference to FIG. 4. The imaging unit 302 shown in FIG. 6, however, includes a support member 360 having a base 361, a plurality of sidewalls 363 projecting from the base 361, and a recess 365 defined by the base 361 and the sidewalls 363. The base 361 and sidewalls 363 can be a preformed, unitary member sized to receive the imaging die 110. As such, the imaging die 110 is received in the recess 365 and attached to the base 361. Another aspect of the illustrated imaging unit 302 is that the unit 302 does not include an adhesive between the cover 150 and the die 110 but rather the dam 190 secures the cover 150 to the imaging die 110. In other embodiments, however, the cover 150 can be attached to the imaging die 110 with an adhesive.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above. Accordingly, the invention is not limited except as by the appended claims.

We claim:

1. A method of manufacturing a plurality of imaging dies on a microfeature workpiece, the method comprising:
   constructing a plurality of imaging dies on the microfeature workpiece, the individual imaging dies including an image sensor and a plurality of bond-pads operably coupled to the image sensor; and
   attaching a plurality of covers to corresponding imaging dies on the workpiece with discrete portions of an adhesive, the discrete portions of the adhesive being disposed between the associated cover and die and outboard the image sensor.

2. The method of claim 1 wherein attaching the covers to the imaging dies comprises:
   depositing the discrete portions of the adhesive onto the covers and/or the imaging dies; and placing the covers on the corresponding imaging dies such that the discrete portions of the adhesive define a cell between the cover and the die.

3. The method of claim 1 wherein attaching the covers to the imaging dies comprises coupling the covers to the imaging dies such that the individual covers are inboard the external contacts.

4. The method of claim 1 wherein the discrete portions of the adhesive are disposed between the associated cover and die to maintain a predetermined distance between the associated cover and die.

5. The method of claim 1, further comprising:
   cutting the microfeature workpiece to singulate the imaging dies; and
   coupling the singulated dies to a support member.

6. The method of claim 5, wherein the step of cutting the microfeature workpiece is performed before the step of attaching the covers to corresponding imaging dies.

7. The method of claim 5, wherein the step of cutting the microfeature workpiece is performed subsequent to the step of attaching the covers to corresponding imaging dies.

* * * * *